US006869915B2

(12) United States Patent
Weinstein

(10) Patent No.: US 6,869,915 B2
(45) Date of Patent: Mar. 22, 2005

(54) CHEMICAL PINNING CENTERS FOR HIGH TEMPERATURE SUPERCONDUCTORS

(76) Inventor: Roy Weinstein, 4368 Fiesta La., Houston, TX (US) 77004

( * ) Notice: Subject to any disclaimer, the term of this patent is extended or adjusted under 35 U.S.C. 154(b) by 585 days.

(21) Appl. No.: 10/039,257

(22) Filed: Dec. 31, 2001

(65) Prior Publication Data

US 2004/0198610 A1 Oct. 7, 2004

(51) Int. Cl.$^7$ ..................... H01B 12/00; C04B 101/00
(52) U.S. Cl. .................. 505/320; 505/120; 505/121; 505/126
(58) Field of Search ................. 505/100, 120, 505/121, 126, 320, 785, 879

(56) References Cited

U.S. PATENT DOCUMENTS 6,083,885 A * 7/2000 Weinstein .................. 505/320
6,525,002 B1 * 2/2003 Weinstein .................. 505/320

OTHER PUBLICATIONS

Sawh et al "Uranium chemistry and pinning centers in high temperature superconductor" Physica C., 305, 159–166 (1998).*

* cited by examiner

Primary Examiner—Mark Kopec
(74) Attorney, Agent, or Firm—D. Arlon Groves; Lee D. Weinstein

(57) ABSTRACT

An oxide superconductor includes a textured superconducting material including an array of defects, where the defects are a compound of two elements foreign to the superconductor, plus other elements native to the superconductor. The two foreign elements include one from group A and one from group B (or alternately the two foreign elements include the element uranium and one element from group C), where group A includes Cr, Mo, W, or Nd, group B includes Pt, Zr, Pd, Ni, Ti, Hf, Ce and Th, and group C includes Zr, Pd, Ni, Ti, Hf, Ce and Th. The array of defects is dispersed throughout the superconducting material. The superconducting material may be the $RE_1Ba_2Cu_3O_{7-\delta}$ compound, wherein RE=Y, Nd, La, Sm, Eu, Gd, Dy, Ho, Er, Tm, Yb, Lu, Tb; the $Bi_2Sr_2CaCu_2O_x$, $(Bi, Pb)_2Sr_2CaCu_2O_x$, $Bi_2Sr_2Ca_2Cu_3O_x$ $(Bi, Pb)_2Sr_2Ca_2Cu_3O_x$ compounds; the $HgBa_2Ca_2Cu_3O_8$ and $HgBa_2CaCu_2O_6$ compounds, the $TlCaBa_2Cu_2O_x$ or $Tl_2Ca_2Ba_2Cu_3O_x$ compounds and compounds involving substitution such as the $Nd_{1+x}Ba_{2-x}Cu_3O_x$ compounds.

7 Claims, 6 Drawing Sheets

100nm

CHEMICAL PINNING CENTERS FOR HIGH TEMPERATURE SUPERCONDUCTORS

FIELD OF THE INVENTION

The present invention relates to superconducting materials, and more specifically to textured superconducting materials with high critical temperature and high critical current density.

BACKGROUND

The phenomenon of superconductivity was first discovered in the early 1900s. A superconducting material conducts current with zero energy loss and expels magnetic field (like a perfect diamagnetic material) when cooled below its transition temperature. The transition temperature ($T_c$) of a superconducting material is called the critical temperature, and is a material-specific temperature. Until the mid-1980s all known superconducting materials were metallic compounds such as mercury (Hg), lead (Pb), and niobium-tin ($Nb_3Sn$). In general, these materials become superconducting at temperatures below 35 degrees Kelvin, depending on the material, by undergoing a transition from the normal resistive state to the superconducting state. For any material in the superconducting state at a given temperature and applied magnetic field, there is a maximum current density that the material is able to conduct without developing resistance. This maximum current density is called the Critical Current Density ($J_c$). $J_c$ for any superconductor is a function of both temperature (T) and external magnetic field (H). As the external magnetic field (H) or the temperature (T) increases, the critical current density $J_c(T, H)$ decreases.

Depending on certain magnetization properties, a superconducting material can be characterized as a type I superconductor or a type II superconductor. When increasing the applied current or magnetic field, or raising the temperature above $T_c$, type I superconductors undergo a direct transition from the perfectly diamagnetic state (i.e., the Meissner state) to the normal state. Type II superconductors, however, first develop a "mixed (vortex) state," wherein the applied magnetic field penetrates the superconducting material above the lower critical field ($H_{c1}$), and then the material undergoes the transition to the normal state above the upper critical field ($H_{c2}$). When the magnetic filed is raised above $H_{c1}$, it becomes energetically more favorable to admit into the material individual flux quanta (called fluxoids) in vortices than to maintain the Meissner state with the total flux exclusion. The vortices are distributed over the superconducting material to achieve an energetic minimum. When a transport current passes through the superconductor in the mixed state, the Lorentz force acts on the vortices, influencing the energy-minimizing pattern in which the vortices form. When the vortices move, electric field is generated which dissipates energy, and the material exhibits resistivity. Chemical and physical defects in the superconducting material can act to keep the vortices "pinned" at the location of the defect. Such defects are therefore referred to as pinning sites or pinning centers. Chemical and physical defects may be viewed as creating localized potential wells which act to hold fluxoids in place. The force that is necessary to break a fluxoid free of the attractive potential of a pinning center is called the pinning force. The pinning force of a given defect depends on the size, shape, orientation and composition of the defect, as well as on the distribution of surrounding defects.

As current flows in a superconducting material, if the Lorentz force (which is proportional to the current density) is less than the pinning forces, the vortices remain in place, and current density remains high. If the Lorentz force exceeds the pinning forces, the vortices start to move and dissipate heat, the material begins to exhibit resistivity, and the Critical Current Density, $J_c$, is reduced.

In the mid-1980s, the first high temperature superconductors (HTS) based on oxides of copper compounds were discovered. Some of these materials displayed superconductivity above liquid nitrogen temperature ($T_c > 77°$ K.), allowing dramatically more practical and economical cooling. For example, the HTS materials can be compounds of $RE_1Ba_2Cu_3O_{7-\delta}$ wherein RE abbreviates Y, or the Rare Earth elements, and the rare earth elements are Nd, La, Sm, Eu, Gd, Tb, Dy, Ho, Er, Tm, Yb, Lu; compounds of $Bi_2Sr_2CaCu_2O_x$, $(Bi, Pb)_2Sr_2CaCu_2O_x$, $Bi_2Sr_2Ca_2Cu_3O_x$ and $(Bi, Pb)_2Sr_2Ca_2Cu_3O_x$; compounds of $TlCaBa_2Cu_2O_x$ or $Tl_2Ca_2Ba_2Cu_3O_x$; and compounds involving substitution such as the $Nd_{1+x}Ba_{2-x}Cu_3O_x$ compounds. These copper oxide superconductors are type II superconductors.

Several researchers have focused on introducing controlled defects into the HTS materials to increase the pinning forces. These defects reduce the movement of the fluxoids and permit high critical currents even at relatively high temperatures and high magnetic fields. Throughout the remainder of this document, unless explicitly stated otherwise, the term "defect" will be used to refer exclusively to intentionally created defects which act as pinning centers.

Magnetic field that penetrates the superconducting material may also lead to "trapped" magnetic field. The trapped field can be pinned in place even when there is no supporting external magnetic field. An ingot of superconducting material with trapped magnetic field not supported by an external magnet is called a trapped field magnet, and is similar in some ways to a permanent magnet. HTS materials with optimally placed and sized defects exhibit higher $J_c$, higher pinning forces, and can support higher trapped magnetic field than HTS materials without defects. HTS materials with pinning centers which are neither of optimum size, nor optimally placed, can improve $J_c$, the pinning forces, and the trapped field to a lesser extent.

When the externally applied magnetic field (or the applied current) is removed, the trapped magnetic fields decay over time. This decay over time is called flux creep. Flux creep tends to stabilize the flux distribution in the superconducting material by relieving the magnetic pressure. Flux creep, which decays approximately logarithmically over time, is a measure of loss of the trapped magnetic field. In a trapped field magnet, because the HTS has near zero resistivity, the current is persistent except for the slow decrease described by creep. The magnetic flux density is held in place by the pinning force and is related to the current density by Ampere's law. If the current density is increased toward the critical current density, $J_c(T)$, flux creep increases.

It is usually desirable for the field in a trapped field magnet to stay stable over time. Optimal sizing and distribution of pinning sites allows for trapped-field magnets capable of supporting higher magnetic fields which are more stable over longer periods of time.

It is also desirable in a current-carrying superconducting wire or tape for the field to stay stable, so that the wire or tape does not develop resistivity, and dissipate energy.

As mentioned above, particular defects increase pinning of the fluxoids. The optimal size, shape, orientation, and distribution of defects depend on the superconductor used, on the direction of the field, and on the temperature. It depends primarily on a parameter (characteristic) of the superconductor called the coherence length, which determines the distance into the superconductor (from the defect) it takes the vortex current of the fluxoid to build up.

Murakami et al (Ref. 3) reported improved $J_c$ by diminishing the size of second phase material in a high temperature superconductor. The superconductor $YBa_2Cu_3O_7$, hereafter called Y123, for example, when formed by a process called melt texturing, has islands of $Y_2BaCuO_5$, hereafter called Y211, a non-superconductor, included as a second phase. This is an inclusion containing only elements normally found in the superconductor. We shall call these native elements. Murakami showed that when the Y211 islands are diminished in size, and/or elongated, they can act as a native chemical pinning centers. We refer to the process of diminishing size and/or elongation of a second phase of native elements by the term "refinement".

Elements not normally found in superconductors may enhance refinement. We call elements not normally found in superconductors foreign elements. C. J. Kim, et al (Ref. 6) showed that Ce improved refinement of the Y211 second phase deposits in Y123.

Sawh et al (Ref. 4) reported improved $J_c$ by forming deposits containing both native elements and foreign elements. Pt was added to the superconductor Y123 in order to refine the second phase deposits of Y211. When U was also added, upon texturing, deposits of a compound of U, Pt, Y, Ba and oxygen formed which acted as pinning centers. Weinstein (Ref. 5) showed that $J_c$ was increased by chemical deposits containing uranium.

Texturing, as defined herein, includes any process of aligning microcrystals or growing larger crystals in a bulk sample, and also includes "natural" texturing that occurs when a thin film is deposited by any of the known physical deposition methods (for example, sputtering, evaporation, epitaxial growth) and is processed in-situ or ex-situ, or when a thick film is deposited (for example, by spin coating). Without texturing, polycrystalline HTS has very low intergrain current density.

In U.S. Pat. No. 6,083,885, Weinstein (Ref. 5) reports improved $J_C$ in a textured superconductor including a defect compound containing uranium and platinum. Weinstein also reports dramatically improved $J_C$ in a textured superconductor who's defect compound contains uranium and wherein the uranium is fissioned by neutron bombardment as part of the preparation method of the superconductor. Although the uranium-doped superconductors reported by Weinstein exhibit great performance characteristics, public fear of materials which are even mildly radioactive has all but prevented any commercial use of these materials.

In general, there is a need for a non-radioactive high-$T_c$ superconducting material with $T_c$ above 77° K. and high values of $J_C$ and $H_{irr}$ (the maximum magnetic field in which the superconductor can conduct current as a superconductor), which can be economically produced in uniform bulk quantities, or in form of thick or thin films, and which is suitable for different superconducting applications. Refinement of second phase pinning centers, composed of native elements, or formation of deposits of compounds containing foreign elements, can be used to create pinning centers to accomplish these aims.

References

1. "High Temperature Superconducting Materials Science and Engineering," Editor Donglu Shi, pg. 290–291, Pergammon (1995).
2. V. Selvamanickam, L. Gao, K. Sun and K. Salama, Appl. Phys. Lett., 54, 2352 (1989).
3. M. Murakami, Proceedings of the TCSUH Internat. Workshop on HTS Materials, Bulk Processing and Applications, Ed. By C. W. Chu et al (Singapore World Scientific Press, 1992), pg. 491.
4. R. Sawh, Y. Ren, R. Weinstein, W. Hennig and T. Nemoto, "Uranium Chemistry and Pinning Centers in HTS," Physica C, 305 (1998) 159–166.
5. U.S. Pat. No. 6,083,885 issued Jul. 4, 2000 to Roy Weinstein, "Method of forming textured high-temperature superconductors."
6. C. J. Kim, K. B. Kim, D. Y. Won, H. C. Moon, D. S. Suhr, S. H. Lai, P. J. McGinn, "Formation of $BaCeO_3$ and its Influence on Microstructure of Sintered/Melt Textured YBaCuO Oxides with Ce $O_2$ addition," Jour. of Materials Research 9 (8), August 1994.

SUMMARY OF THE INVENTION

In one aspect, the invention offers a non-irradiation enhanced, textured oxide superconducting material with significantly higher $J_C$ and $H_{irr}$ than superconducting materials currently made with other non-irradiation-enhanced techniques. Initial measurements indicate that bulk samples of the textured oxide superconducting material 2 cm in diameter and 0.8 cm in length, improved by this invention, more than doubled their current densities and trapped magnetic fields at T=77° K. For example, whereas comparable material not improved by this invention had current densities of 10,000 A/cm² and trapped magnetic fields of about 4,500 Gauss, those materials, when improved by this invention had current densities of over 20,000 A/cm², and trapped magnetic fields of over 7,000 Gauss. It is believed that with optimal size and distribution of defects, oxide superconductors with defects described below will achieve average current densities of 60,000 A/cm², and in a 2 cm diameter, 0.8 cm length sample, trapped magnetic fields above 24,000 Gauss at T=77° K. Unlike previous improvements, found for irradiated uranium-doped HTS (and reported in Ref. 5) many of the new materials disclosed herein are entirely non-radioactive, and therefore may be more suitable for commercial use.

In one aspect of the present invention, inn any specified superconductor the defects taught by this invention incorporate more than one foreign element. In the present invention it is important that at least two foreign elements be involved in the chemical defects, or deposits which act as pinning centers.

In a preferred embodiment of this invention, two foreign chemical elements are involved in forming defect deposits in the superconducting material. One of the two chemicals is chosen from the group of elements (which we hereafter refer to as group A): Cr, Mo, W, Nd. The second element may be chosen from the group of elements (which we hereafter refer to as group B): Pt, Pd, Ni, Ti, Zr, Hf, Ce and Th.

In another preferred embodiment of this invention, two foreign chemical elements are involved in forming defect deposits in the superconducting material, where the first foreign chemical element is Uranium, and the second element may be chosen from the group of elements (which we hereafter refer to as group C): Pd, Ni, Ti, Zr, Hf, Ce and Th.

The selected foreign elements combine with native elements in the high temperature superconductor to form small, profuse, stable chemical deposits, which are defects in the superconductor and act as pinning centers.

In another aspect of this invention, an oxide superconductor includes a textured superconducting material including an array of defects finely dispersed throughout the superconducting material. These defects include a compound (hereinafter referred to as the defect compound) that comprises barium, oxygen, at least one rare earth element, and at least two foreign chemical elements, one from group A, and one from group B. The deposits of the defect compound can be sufficiently profuse to increase $J_c$ by 200%, while not spoiling the texturing of the superconductor.

In another aspect of this invention, these defects include a defect compound that comprises barium, oxygen, at least one rare earth element, and at least two foreign chemical elements, where the first foreign chemical element is uranium (U), and the second foreign chemical element is from group C, where group C comprises Pd, Ni, Ti, Zr, Hf, Ce and Th. The deposits of the defect compound can be sufficiently profuse to increase $J_c$ by 200%, while not spoiling the texturing of the superconductor.

In a preferred embodiment, for example, addition of Mo and Pt in amounts to be described below, to Y123 results in the formation of a five element compound, containing Mo, Pt, Y, Ba and O. The deposits of this compound in Y123 are profuse, stable, and about 300 nm in size. Similarly, in another preferred embodiment, the addition of U and Zr to $NdBa_2Cu_3O_7$, hereafter referred to as Nd123, results in the formation of a five element compound containing U, Zr, Nd, Ba and O. The deposits of this compound in Nd123 are profuse, stable and about 400 nm in size. The two foreign elements, U and Zr combine with three native elements to form small deposits which act as defects and pinning centers.

Preferred embodiments of these aspects include one or more of the following features: The one rare earth element is preferably yttrium, neodymium, or samarium, but may also be lanthanum, europium, gadolinium, dysprosium, hafnium, erbium, thulium, ytterbium, terbium, or lutetium or their combination. The defect compound forms a pinning site. If the rare earth element is yttrium and the chemical elements are tungsten and platinum, the defect compound has substantially the following atomic ratio $(W_xPt_y)YBa_2O_6$, where $x+y=1$, and x and y are greater than zero. Alternatively, platinum may be replaced with any of the elements listed in group B, and W may be replaced by any of the elements in group A, but such a defect compound still has substantially similar stoichiometry as the tungsten-platinum-yttrium-barium defect compound. Alternately, W may be replaced by uranium (U), and platinum may be replaced by any of the elements in group C, and such a defect compound still has substantially similar stoichiometry as the tungsten-platinum-yttrium-barium defect compound. The defect compound may include Zr as the element from group B, and U may be the element from group A. In a preferred embodiment of the invention Zr and U may be used to form deposits of $(U_{0.5}Zr_{0.5})NdBa_2O_6$ which act as pinning centers in Nd123. W, substituted for U in this embodiment is also a preferred embodiment. Alternatively Nd is replaced with another Rare Earth element, and such compound still has substantially similar stoichiometry as the tungsten-zirconium-yttrium-barium compound.

In a preferred embodiment of the described defect deposits, the structure of the defect deposits containing the foreign and native elements is preferably a compound having structure known to those versed in the arts as a double perovskite.

Preferred embodiments of this aspect include one or more of the following features: The defect deposits may be predominantly between 10 nanometers and 1000 nanometers in size, but preferably the defects are between 10 and 500 nanometers. These deposits, which act as pinning centers, appear as defects in the crystal or grain structure of the superconductor. These deposits often assume a potato-like shape, and they act to displace and disturb the superconductor much as potatoes disturb the earth in which they grow. We will henceforth refer to these deposits as "potatoes." All use of the word "potato" in the plural or singular in the remainder of this document shall refer exclusively to these often potato-shaped microscopic defect deposits in the superconducting material.

In another aspect of the invention, an oxide superconductor includes a textured superconducting material with an array of potatoes including a compound of an element of group A and an element of group B, wherein the array of potatoes is dispersed throughout the superconducting material.

Preferred embodiments of the above aspects include one or more of the following features: The textured superconducting material is a Y123 superconducting material, an Nd123 superconducting material, a SmBaCuO superconducting material (hereafter called Sm123) a (Bi,Pb)SrCaCuO superconducting material (hereafter called BiSCCO) an HgBaCaCuO superconducting material, or a TlBaCaCuO superconducting material. The defect-introducing elements are one from group A, such as W, and one from group B, such as Zr, and the compound further includes barium, oxygen and at least one rare earth element. The rare earth element is preferably yttrium, neodymium or samarium, but may also be lanthanum, europium, gadolinium, dysprosium, hafnium, erbium, thulium, ytterbium or lutetium or their combination.

Preferred embodiments of the above aspects may also include one or more of the following features: The oxide superconductor, wherein the element from group A is tungsten or molybdenum and the element from group B is Pt or Zr, and the compound further includes barium, oxygen, and at least one rare earth element. The compound includes chemical elements with substantially the following atomic ratios $(W_xPt_y)YBa_2O_6$, where $x+y=1$, and x and y are both greater than zero. The defects formed by the compound are predominantly between 10 nanometers and 1000 nanometers in size, and more preferentially between 20 nm and 500 nm. The compound includes tungsten in an amount of [0.01% to 0.54%] of the weight of the material, or molybdenum in an amount of [0.01% to 0.28%] by weight, or $UO_4 \cdot 2H_2O$, in an amount 0.01% to 1%. The compound includes Pt in an amount 0.01% to 0.5%, or Zr in an amount 0.01% to 0.47%, or Ce in an amount 0.1% to 0.72%.

In a preferred embodiment, the percent by weight of the element from group A is less than $6\% \times M_A/338$, where $M_A$ is the gram atomic weight of the element from group A, and the percent by weigh of the element from group B is less than $3.5\% \times M_B/195$, where $M_B$ is the gram atomic weight of the element from group B.

Preferred embodiments of the above aspects may also include one or more of the following features: A superconducting trapped-field magnet made of the above-described oxide superconductors capable of maintaining a persistent circulating current within the oxide superconductor material. The current density of the circulating current is in the range 1000 to 300,000 amps per square centimeter. A magnetic shield made of the above-described oxide superconductors capable of maintaining in a superconducting state a persistent circulating current within the oxide superconductor material. The current density of the circulating current is in the range 1000 to 300,000 amps per square centimeter. A superconducting wire made of the above-described oxide superconductors. A magnetic levitator made of the above-described oxide superconductors. The levitator exhibits in a superconducting state the current density in the range 1000 to 300,000 amps per square centimeter.

In another aspect, an oxide superconductor is made by a method including the steps of: providing a precursor superconducting material; providing at least one chemical element from group A and one from group B (or U and one element from group C) or their oxides, or their carbonates, or nitrates combining the precursor superconducting material with both of the foreign chemical elements; and texturing the precursor superconducting material combined with the foreign chemical elements to form a textured superconducting material including an array of potatoes, the array of potatoes being dispersed throughout said superconducting material.

Preferred embodiments of the above aspects include one or more of the following features: The oxide superconductor is one of the following: a BiSrCaCuO superconducting material, a (Bi, Pb)SrCaCuO superconducting material, a (Rare Earth)BaCuO superconducting material, an HgBaCaCuO superconducting material, or a TlBaCaCuO superconducting material, or any of these superconductors mixed and textured so as to achieve substitution. The precursor superconducting material is a stoichiometric mixture or a non-stoichiometric mixture of chemical elements of an oxide superconductor. The chemical elements from groups A and B (or the element U and an element from group C) are included in a compound, and the non-stoichiometric mixture includes a selected deviation from a stoichiometry of the oxide superconductor, the deviation being selected with respect to stoichiometry of the compound including the foreign elements or any mixture thereof. The defect-producing element (one from group A and one from group B, (or U and one element from group C) or some mixture thereof or the element U and one element from group C) is included in a compound, and the non-stoichiometric mixture includes a selected deviation from a stoichiometry of the oxide superconductor, the deviation being selected with respect to stoichiometry of the compound including the amount of defect-producing elements. The defect-producing elements substantially replace one or more of the elements of the above superconducting materials within the defect compound.

Preferred embodiments of the above aspects may also include one or more of the following features: The defect-producing foreign elements are in the form of powdered oxides and the combining step of the method includes mixing the powdered oxides with the precursor superconducting material. The defect producing foreign elements, when initially added to the mix of powders should be as small as possible, with sizes as small as a few tens of nanometers being especially preferred. The smallest caliber and/or softest compounds are especially preferred for the defect-producing foreign elements. For example, when adding uranium, $UO_4 \cdot 2H_2O$ (uranium peroxide) is preferred. It is milled most easily to calibers in the nanometer regime. $UO_4 \cdot 2H_2O$ can be prepared by producing a solution of uranium by dissolving the element in an acid; neutralizing the acid; and precipitating the uranium from the solution as an oxide. The acid includes nitric acid. The acid is neutralized with ammonium hydroxide. Precipitation is aided by hydrogen peroxide and zero-degree centigrade temperature.

Preferred embodiments may also include one or more of the following features: The defect-producing foreign elements are mixed with native elements of the HTS in a stoichiometric mixture having the same stoichiometry as the potatoes. These are then reacted, sintered or textured into the compound desired for the potatoes. These compounds are then finely milled and added to the HTS powders and sintered. This procedure maintains the stoichiometry of the HTS when the potatoes form, instead of taking rare earth, Ba, or Cu from the HTS to form the potatoes. A preferred embodiment would create $(W_{0.5},Pt_{0.5})YBa_2O_6$ separately from HTS powders. The (WPt)YBaO compound would then be added to the HTS powders for Y123, and sintered. It may be beneficial in forming the compound for the potatoes to use Cu as a catalyst to enhance the reaction.

DETAILED DESCRIPTION

In one preferred embodiment, 0.75% Pt by weight, and 0.44% W by weight, in the form of $WO_3$, was added to a powder of $YBa_2Cu_3O_{7-\delta}$ (Y123) plus 30% molar $Y_2BaCuO$. These chemicals were mixed, and then ball milled for 72 hours. Cylindrical forms about 1 inch in diameter were filled with the mixed powders and compacted by a uniaxial press, using a force of 5,000–20,000 lbs. The mass of a sample compacted in this way is about 25 grams. A seed of Sm123 was implanted in the center of the top of the sample and the sample was placed in a programmable oven. The temperature was first increased to 925° C. and held there for 4.5 hours, in order to sinter the sample. Then the temperature was increased to 1025° C., to melt the powders, and held at this temperature for 1 hour. The temperature was then decreased at 1° C. per hour for 120 hours and then cooled to room temperature at 4° C. per hour. These samples were later characterized by trapped field measurement. During the slow cooling, clusters of microcrystals formed a textured grain. The grain grew to 2 cm diameter×0.8 cm axial length.

Figure 1:
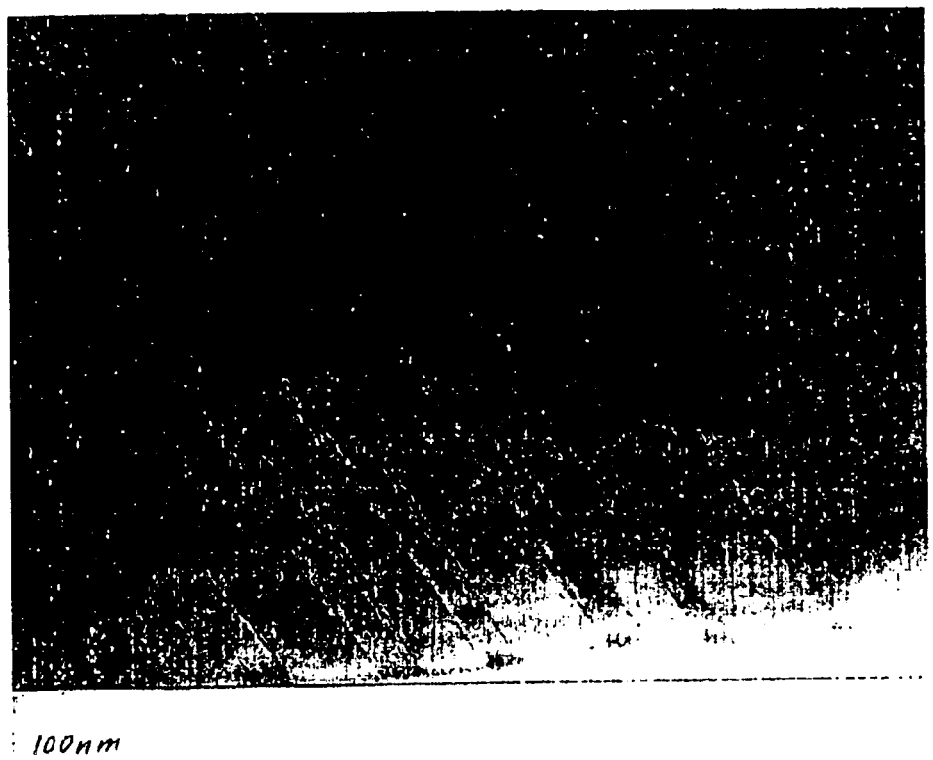
FIG. 1 is a Transmission Electron Microscope (TEM) study of a platinum-tungsten-YBCO superconducting material, showing potatoes of WPtYBaO.

The tungsten-platinum Y123 grains were composed of many microcrystals with parallel (a, b) planes. Upon the above melt texturing process, deposits of tungsten-platinum-yttrium-barium-oxide material formed stable potatoes within the YBCO superconductor. Potatoes of $(W_xPt_y)$ $YBa_2O_3$ solidified within the YBaCuO grain, where x=0.5±0.1 and y=0.5 M 0.1. The size of these potatoes was about 300 microns. The potatoes, and YBaCuO, are stable. After texturing, the tungsten-platinum HTS superconducting material exhibited an increase in the critical current density $J_c$, compared to similarly prepared samples without addition of tungsten and platinum. The $J_c$ of the grains containing WPtYBaO potatoes was about twice the $J_c$ of grains prepared in the same way, but without W addition. The tungsten and platinum formed a new, very finely dispersed compound, within the textured YBCO array of microcrystals. The atomic proportions of yttrium, tungsten, platinum, barium and oxygen in the potatoes were close to $(W_{0.5}Pt_{0.5})$ $YBa_2O_6$. FIG. 1 is a Transmission Electron Microscope (TEM) micrograph of platinum-tungsten-Y123 finished material, wherein the platinum-tungsten-yttrium-barium-oxygen potatoes are seen.

By using a seed crystal which has a higher melting temperature than the superconducting crystal being formed, the entire melt grows into substantially a single grain and can reach sizes of 10 cm diameter×5 cm axial length. If a Y123 superconductor is being produced, a Sm123 seed crystal may be used. If a Sm123 superconductor is being produced, a Nd123 seed may be used. The advantage of a seed is that the grain-planes will grow parallel to the seed crystal planes, and can be controlled using the seed. The seed also allows the desired grain to grow at a higher temperature than it normally would and to grow into a sizable crystal before many small randomly oriented crystals are formed by multi-nucleation.

Figure 2:
FIG. 2 is a TEM micrograph of a molybdenum-platinum-YBCO superconducting material showing potatoes of the compound MoPtYBaO.
Figure 3:
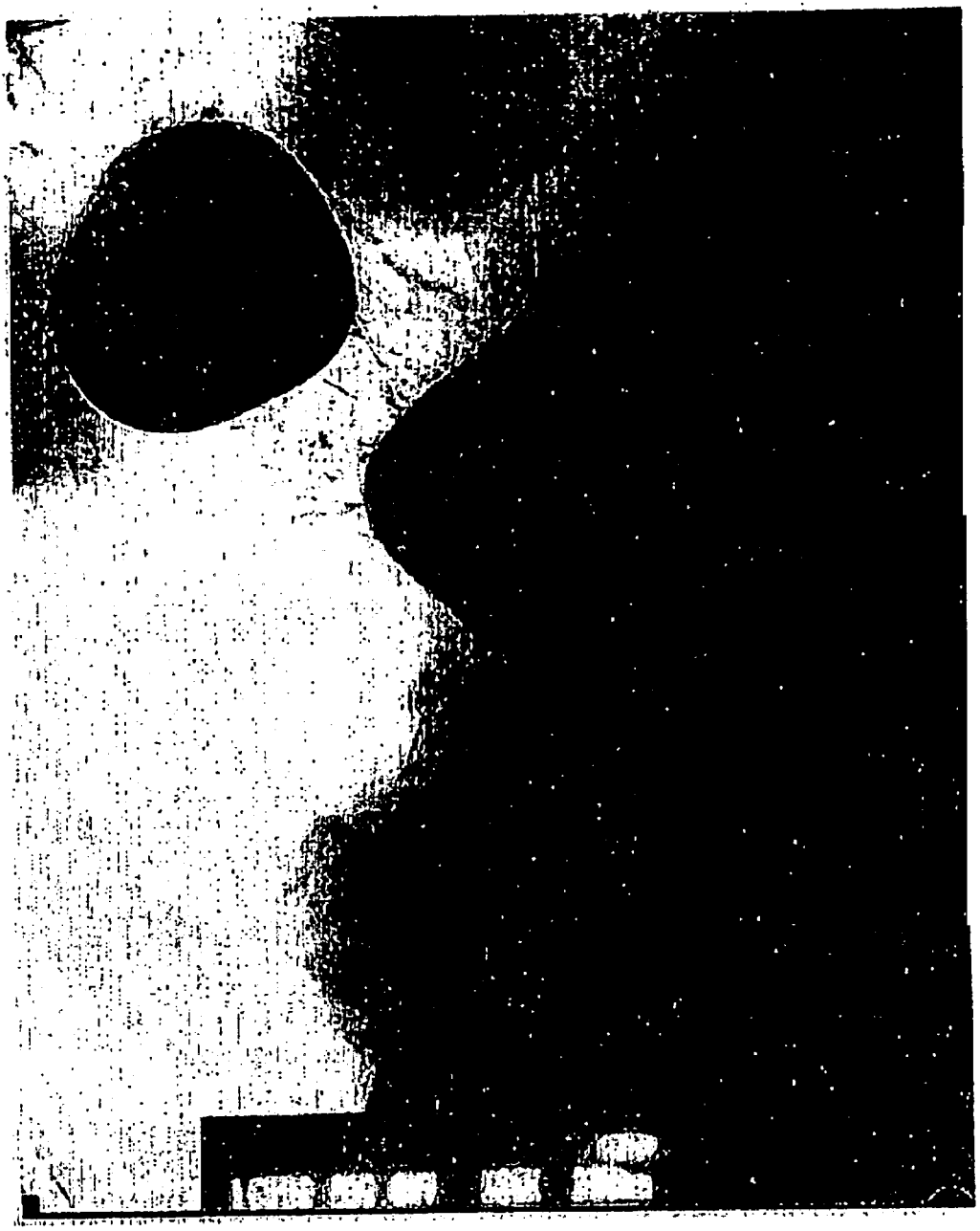
FIG. 3 is an SEM photomicrograph of a platinum-uranium-SmBCO superconducting material, showing potatoes of UPtSmBaO.

In place of the W,Pt pair of foreign elements, Mo,Pt may be used. The molybdenum-platinum-YBCO material yields similar results, shown in FIG. 2. The black background is the Y123 material. The platinum-uranium-SmBCO material yields similar results as shown in FIG. 3.

Figure 4:
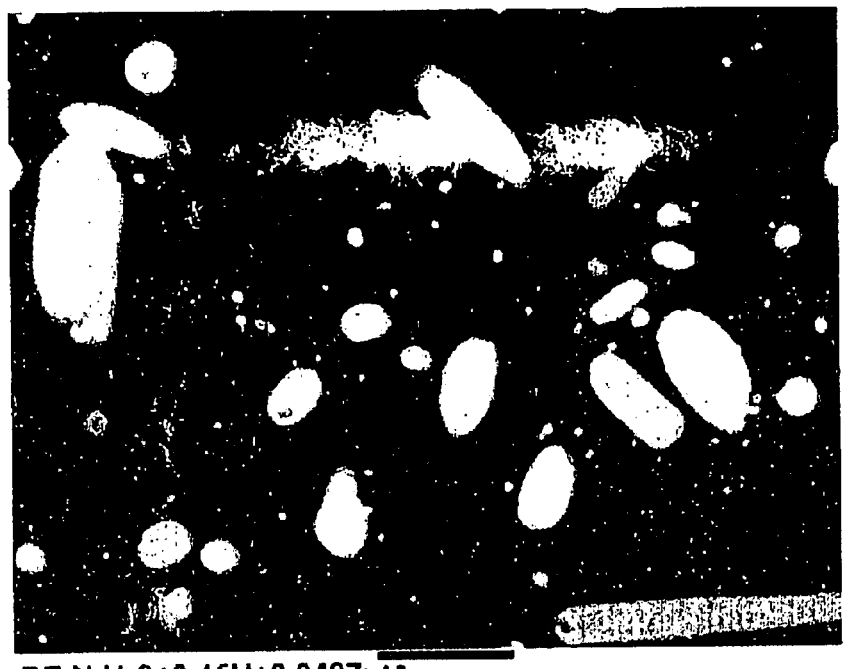
FIG. 4 is a microprobe photomicrograph of a uranium-zirconium-Nd123 superconducting material, showing potatoes of UZrNdBaO.

In place of (W,Pt) or (Mo,Pt), (U,Pt) may be used in Y123, or (U,Zr) may be used in Nd123. The uranium-zirconium-Nd123 yields similar results. FIG. 4 shows a microprobe study of the U, Zr, Nd123 material.

Figure 9:
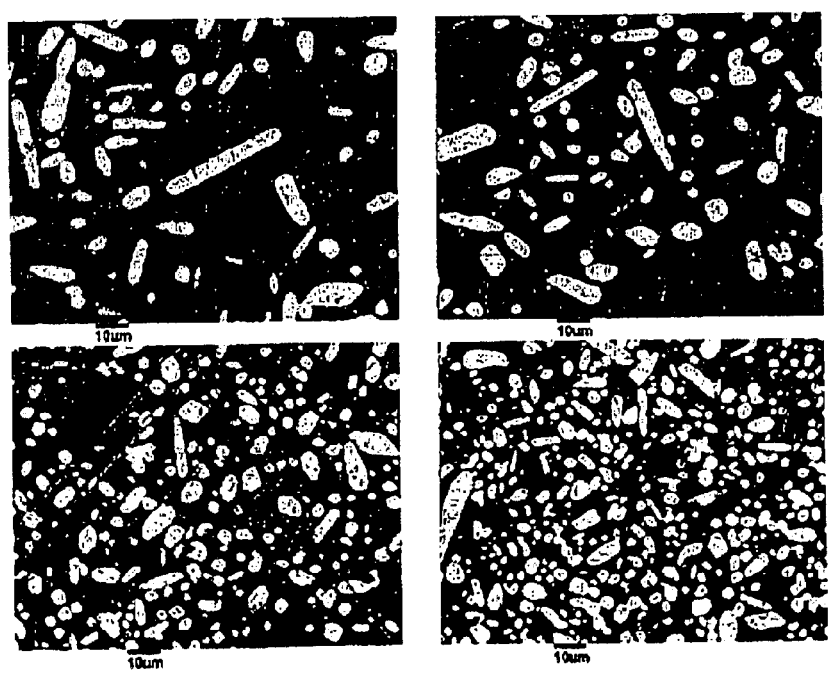
FIG. 9 is a microprobe study showing the effect of Zr texturing of second phase deposits of Nd422 in the Nd123 superconductor.

The addition of platinum alone (for example, 0.5% platinum by weight) to the Y123 powders forms a different compound than does tungsten-platinum-Y123. Addition of Pt alone forms a compound $PtBa_4Cu_2O_7$. Platinum alone does reduce the size of the secondary, non-superconducting, phase (i.e., Y211) within the Y123 material, a process usually called "refinement." It also promotes better texturing of the Y123 material. However, it does not form the deposits described here as potatoes. Similarly, the addition of Zr to Nd123 refines the second phase deposits of Nd422, however small well dispersed potatoes do not form. FIG. 9 shows the effect of Zr refining Nd422 deposits in Nd123.

Figure 6:
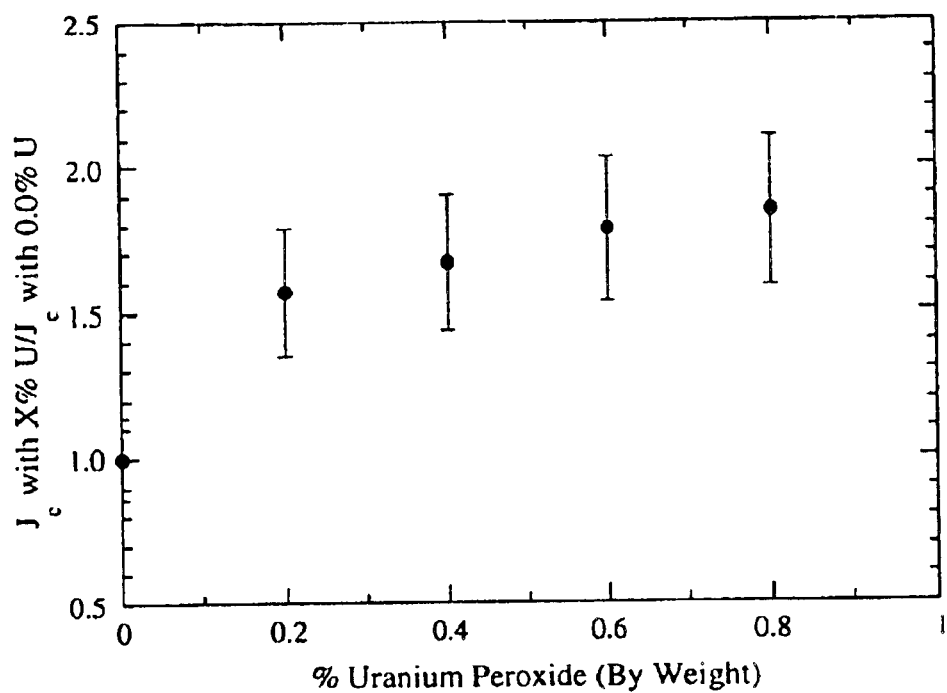
FIG. 6 depicts graphically the critical current density as a function of the amount of defect compound content in which the defects are uranium and platinum in Y123.
Figure 7:
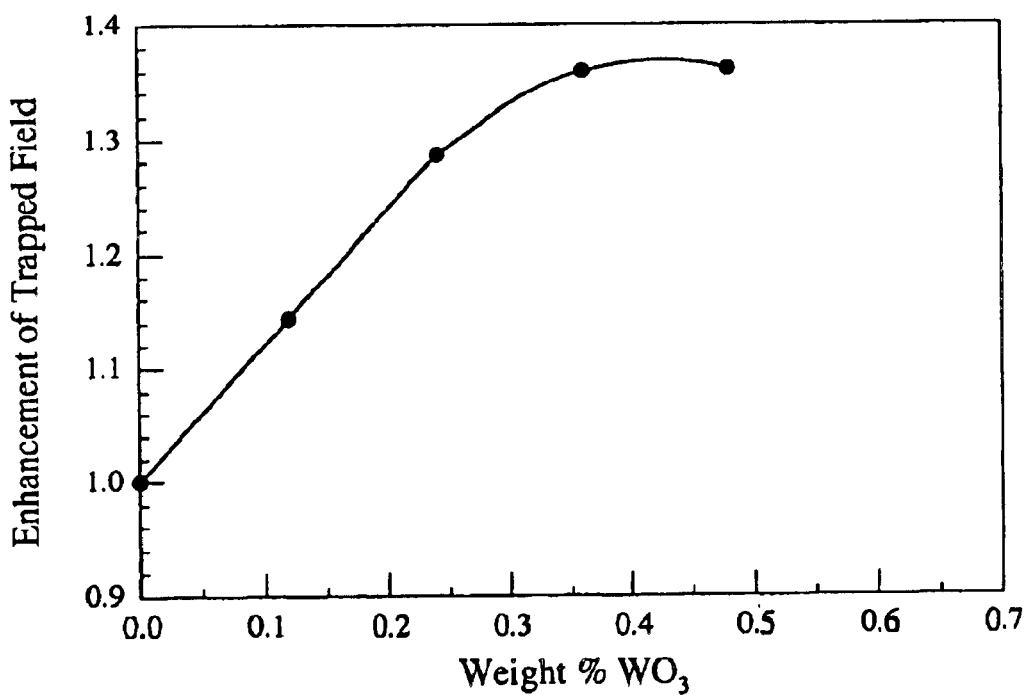
FIG. 7 depicts graphically the trapped field vs. % $WO_3$ (wt) added to Y123 containing 1.25% Pt (wt).

FIG. 6 summarizes the effect of adding uranium on the critical current density of Y123, when Pt has also been added. FIG. 7 shows that the effects of adding tungsten to Y123+Pt are similar to the effects of adding uranium. All these compounds exhibit long-term stability within the Y123 matrix.

Figure 8:
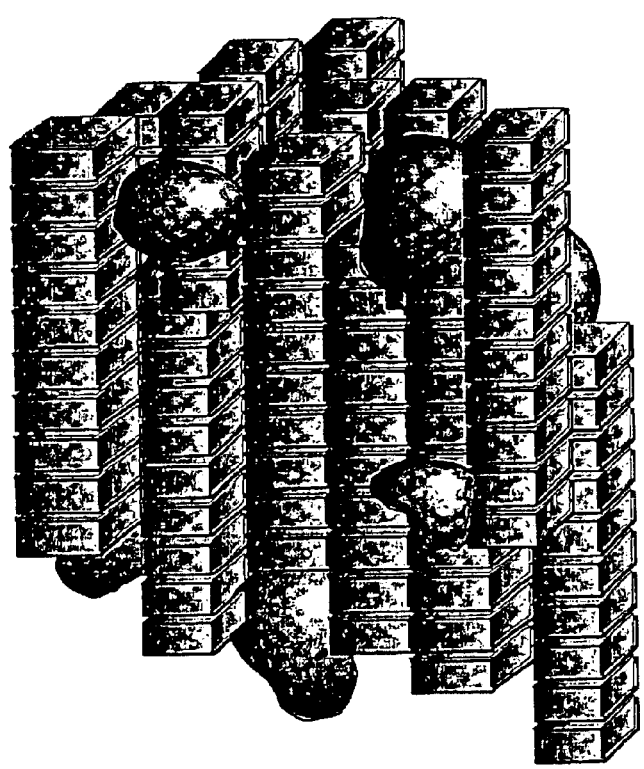
FIG. 8 is a schematic intended to depict the many microcrystals which make up a grain, and the way the potatoes are distributed among the microcrystals.
Figure 10:
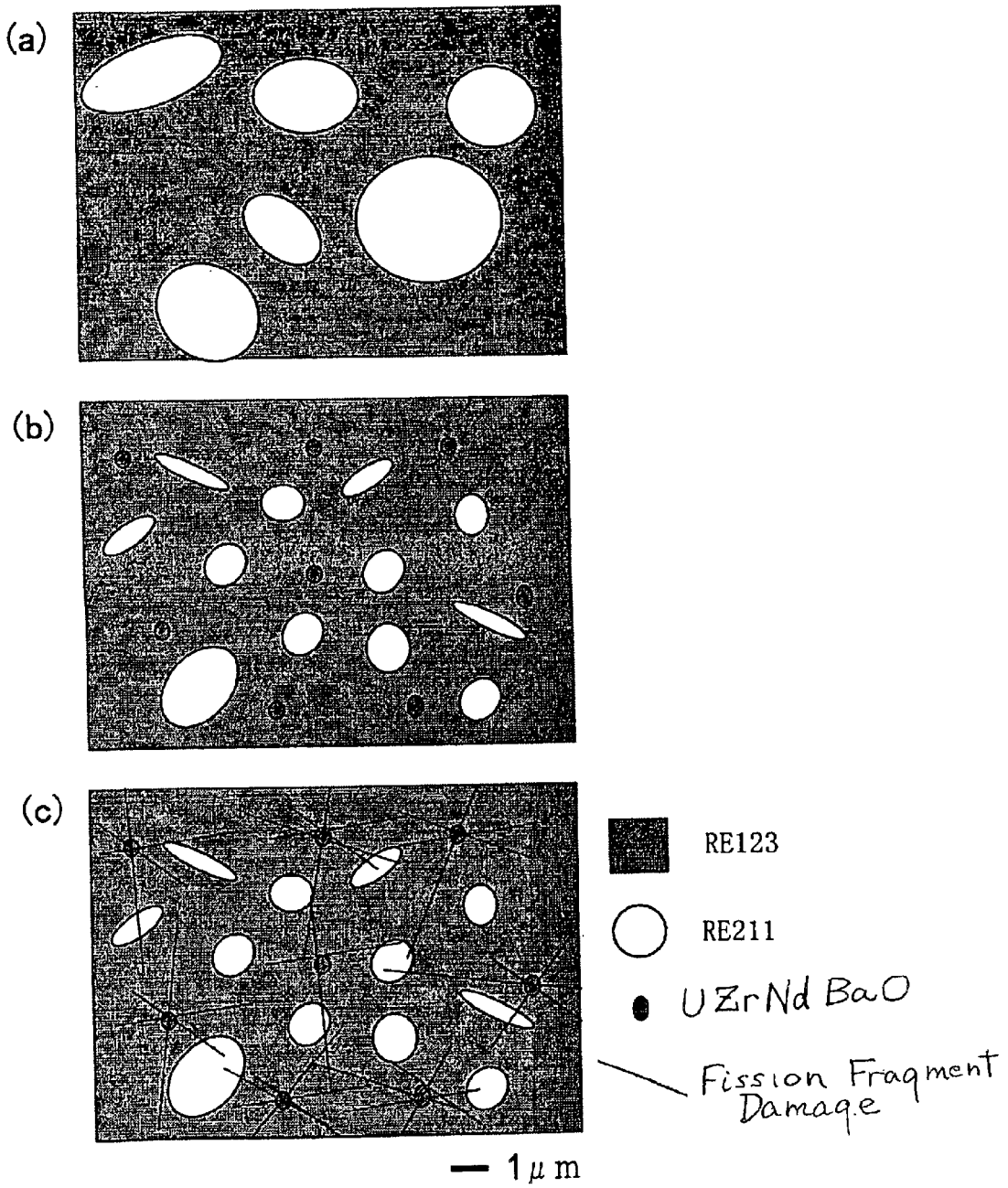
FIG. 10 is a schematic showing three different classes of pinning centers based on (i) refinement, (ii) potatoes, and (iii) fission.

FIG. 8 is a schematic attempting to show how potatoes are embedded within textured superconductor, and FIG. 10 shows the three classes of pinning centers discussed herein: (i) refinement, (ii) potatoes, and (iii) aligned damaged by fission fragment ions.

Alternatively, the powders containing the HTS chemicals and foreign chemicals may be pressure textured as described by Jamny et al. "Processing and Properties of Ag Clad BiSCCO Superconductors", Proceedings of the 10th Anniversary HTS workshop, Houston, Tex., Ed. B. Batlog et al., World Scientific Press (1996).

Figure 5:
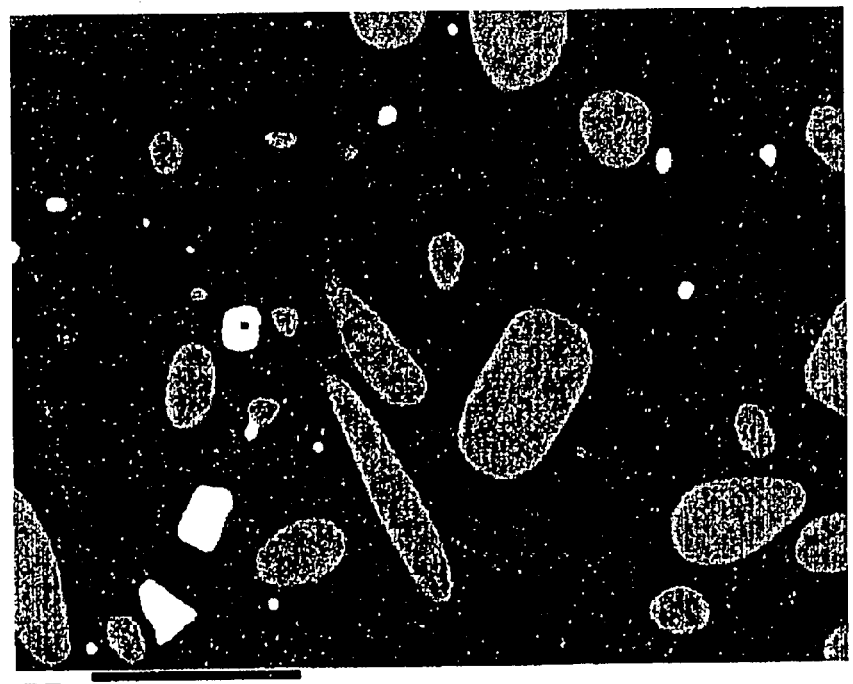
FIG. 5 is a microprobe photomicrograph of a pre-reacted compound of UPtYBaO subsequently mixed with powders of Nd123 and then textured.

In another preferred embodiment, the stable defect compound of tungsten-platinum-yttrium-barium-oxygen is formed externally rather than as the integral part of the melt texturing process described above. In this process, component powders of the defect compound, e.g., $(W_{0.5}Pt_{0.5})$ $YBa_2O_6$, are first reacted by sintering or texturing. A preferred embodiment of this reaction uses copper as a catalyst. The compound of e.g., WPtYBaO is then crushed, milled, and added to the HTS powders (e.g., Y123). Then, the combined powders are textured. FIG. 5 shows a Microprobe study of UPtYBaO potatoes formed in Nd123 in this way. In another preferred embodiment, the stable defect compound of tungsten-Pt—Y—Ba—O is formed externally rather than as an integral part of the melt-texturing process described above. The defect compound, e.g. $(W_{0.5}Pt_{0.5})YBa_2O_6$ is powdered, and the powder is added to an HTS mixture with a rare earth which may be the same or different than is contained in the mixture which will produce the potatoes, e.g. NdBaCuO. The combined powders are then textured by any of the standard techniques known in the art.

In general any two elements, one from group A and one from group B (or U and one element from group C) along with elements native to the superconductor may be used to create potatoes, where group A is Cr, Mo, W, or Nd, group B is Pt, Pd, Ni, Ti, Zr, Hf, Ce or Th, and group C is Pd, Ni, Ti, Zr, Hf, Ce or Th. These combinations may be used together with any HTS material from the following groups of compounds: (i) $RE_1Ba_2Cu_3O_{7-\delta}$ with RE=Y, Nd, La, Sm, Eu, Gd, Dy, Ho, Er, Tm, Yb, Lu; (ii) $Bi_2Sr_2CaCu_2O_x$, $(Bi,Pb)_2Sr_2CaCu_2O_x$, $Bi_2Sr_2Ca_2Cu_3O_x$ or $(Bi,Pb)_2Sr_2Ca_2Cu_3O_x$ compound (BiSCCO or (BiPb)SCCO); or (iii) $HgBa_2Ca_2Cu_3O_8$ or $HgBa_2CaCu_2O_6$, or (iv) $TlCaBa_2Cu_2O_x$ or $Tl_2Ca_2Ba_2Cu_3O_x$ compound (TlBCCO) or (v) materials using substitution such as $Nd_{1+x}Ba_{2-x}Cu_3O_{7-\delta}$. These compounds may be prepared using the standard methods known in the art and texturing. For example, the tungsten-platinum-Y123 material can be produced by forming first the $(W_xPt_y)YBa_2O_6$ compound, where x=0.5±0.1 and y=0.5 M0.1. Alternatively, the molybdenum-platinum-Y123 material can be produced by forming first the $(Mo_xPt_y)YBa_2O_6$ compound, where x=0.5±0.1 and y=0.5 M0.1. In the formation of these compounds it is useful to use Cu as a catalyst. A mixture of the tungsten-platinum and molybdenum-platinum compounds may also be formed. One of these compounds or a mixture of these compounds is then added to HTS material before texturing. This method may be a preferred embodiment to improve the textured Y123, Nd123, Sm123, or BiSCCO superconductors.

The tolerance of the HTS material to elements or oxides of group A or group B can vary with the HTS material chosen. In another embodiment $WO_3$ (from group A) and $ZrO_2$ are added to the HTS $NdBa_2Cu_3O_7$. 0.54 weight % of the element W, and 0.23 weight % of the element Zr are used. The mixture of powders, including about 20% of $Nd_4Ba_2Cu_2O_{10}$ is then ball milled and melt-textured by any method known in the art. This results in potatoes of size about 500 nanometers well distributed throughout the HTS. In addition, the presence of the Zr results in refinement of the $Nd_4Ba_2Cu_2O_{10}$ phase.

The lower limit of the foreign elements used is that which simply provides too few deposits to be useful, and can be any weight % above zero.

In another embodiment, a thick film YBCO based superconductor is prepared as follows: A $Ba_2YCu_3O_{7-x}$ film is deposited on a substrate (for example, a polished (001) or (100) and preferably (100) $SrTiO_3$ substrate) from an organic solution containing metal trifluoroacetates prepared from powders of $BaCO_3$, $YCO_3$-$3H_2O$ and $Cu(OH)_2CO_3$ combined in a 2:1:3 ratio, and a tungsten oxide or molybdenum oxide powder, and metallic platinum or zirconium oxide powders. These powders are reacted with between 20–30% (5.5–6.0M) excess trifluoroacetic acid in methyl alcohol followed by refluxing for approximately four hours to produce a solution substantially 0.94M based on copper content. This precursor solution is applied to the substrate with a photoresist spinner operating at a speed in the range of approximately 3000–5000 rpm for a 0.25"×0.25" substrate. Spin coating parameters can be adjusted to accommodate substrates of different types and varying dimensions. The thickness of the coatings is adjusted to obtain the final superconducting film thicker than 200 nm, preferably thicker than 300 nm and more preferably thicker than 500 nm. The precursor coating is heated slowly at a rate approximately in the range of 0.50° to 1.0° C./min in moist oxygen having a dew point approximately in the range of 20° C. to 75° C. to a temperature approximately in the range 300°–500° C. After this heating step is complete, the coating is heated again for approximately one hour in a moist reducing nitrogen-oxygen gas mixture having a composition approximately in the range of 0.5 to 5.0% oxygen at a temperature less than 810° C. Following this heat treatment, the coating is cooled from the specified temperature range in dry oxygen for approximately 8 or more hours at a temperature in the range 400° C. to 500° C. This method is described in detail in U.S. Pat. No. 5,231,074, which is incorporated by reference. Alternatively, an HTSC film doped with one foreign element from group A, and one from group B (or doped with U and one element from group C) is prepared by other methods described in this patent.

In other embodiments, the HTS materials, and films, wires and coils made of the HTS materials, are prepared by fabrication methods described in U.S. Pat. Nos. 5,683,969; 5,661,114; 5,659,277; 5,635,456; 5,604,473; 5,581,220; 5,531,015; 5,525,583; 5,472,527; 5,455,223; 5,321,003; 5,116,810; 5,034,373; 5,670,459; 5,696,057; 5,705,457; 5,541,154; 5,660;541; 5,665,682; 5,646,097; 5,652,199. All these fabrication methods are incorporated by reference as if fully included herein. The element from group A, and the element from group B (or U and an element from group C) may be included at various stages of the HTS material fabrication to disperse the elements or their compounds or precipitates and deposits of their compounds into a matrix formed by the HTS material.

The above-described methods are applicable to production of the high $T_c$ superconducting materials in a bulk form, or in a thin or thick film forms. The superconducting films may be fabricated on substrates suitable for lattice matching and on substrates with buffer layers to improve the superconducting properties of the films by improving the texturing and preventing formation of unwanted interface compounds or substrate influence. (See, for example, U.S. Pat. No. 5,602,080)

The bulk material may be used for production of wires or ingots with high values of $J_c$. The superconducting bulk materials may be used in numerous applications including transmission lines, fault current limiters, high field magnets or trapped field magnets for motors, generators, particle separators, flywheels or accelerators, energy efficient large area dipole magnets for industrial or laboratory use, bearings, or even for levitation for trains, magnetic bumper-tether and others. The superconducting thick films may be used for resonator cavities, superconducting shields and other. The superconducting thin films may be used for dc or rf SQUIDs or other SQUID based instruments, Josephson switching devices, logic gates, memory cells, analog-to-digital converters, Josephson arrays as high frequency sources, quasiparticle mixers and detectors, hybrid superconductor-semiconductor devices, nonequilibrium superconducting devices, or other three-terminal devices.

The HTS materials described above can be sufficiently cooled for different commercial applications by liquid nitrogen (T=77 K), liquid air (T=80 K), liquid helium (T=4K), or cryorefrigerators. Furthermore, the HTS materials are suitable for space applications.

The foregoing discussion should be understood as illustrative and should not be considered to be limiting in any sense. While this invention has been particularly shown and described with references to preferred embodiments thereof, it will be understood by those skilled in the art that various changes in form and details may be made therein without departing from the spirit and scope of the invention as defined by the claims.

Additional embodiments are within the following claims:

What is claimed is:

1. An oxide superconductor comprising: a textured superconducting material including an array of defects dispersed throughout said superconducting material, said defects comprising a defect compound comprising the defect element uranium and a second defect element from group C (Zr, Pd, Ni, Ti, Hf, Ce, Th).

2. The oxide superconductor of claim 1, wherein said defects are between 5 nm and 2000 nm in size.

3. The oxide superconductor of claim 1, wherein said superconducting material comprises a $RE_1Ba_2Cu_3O_{7-\delta}$ compound, wherein RE=Y, Nd, La, Sm, Eu, Gd, Dy, Ho, Er, Tm, Yb, Lu, Tb; the $Bi_2Sr_2CaCu_2O_x$, $(Bi, Pb)_2Sr_2CaCu_2O_x$, $Bi_2Sr_2Ca_2Cu_3O_x$ and $(Bi, Pb)_2Sr_2Ca_2Cu_3O_x$ compounds; the $HgBa_2Ca_2Cu_3O_8$ and $HgBa_2CaCu_2O_6$ compounds, the $TlCaBa_2Cu_2O_x$ or $Tl_2Ca_2Ba_2Cu_3O_x$ compounds and compounds involving substitution such as the $Nd_{1+x}Ba_{2-x}Cu_3O_x$ compounds.

4. The oxide superconductor of claim 3, wherein said defects are between 10 nm and 1000 nm in size.

5. A superconducting trapped-field magnet comprising the oxide superconductor of claim 1 capable of maintaining a persistent circulating current within said oxide superconductor.

6. The trapped-field magnet of claim 5 wherein the current density of said circulating current is in the range 100 to 300,000 amps per square centimeter.

7. A magnetic shield comprising the oxide superconductor of claim 1 capable of maintaining in a superconducting state a persistent circulating current within said oxide superconductor.

* * * * *

UNITED STATES PATENT AND TRADEMARK OFFICE
CERTIFICATE OF CORRECTION

| | | |
|---|---|---|
| PATENT NO. | : 6,869,915 B2 | Page 1 of 1 |
| APPLICATION NO. | : 10/039257 | |
| DATED | : March 22, 2005 | |
| INVENTOR(S) | : Roy Weinstein | |

It is certified that error appears in the above-identified patent and that said Letters Patent is hereby corrected as shown below:

In the Specification

Column 1, line 9, after density should include the following paragraph:

This invention was made under a contract with an agency of the U.S. Government. The name of the U.S. Government agency and Government contract number are: US Army Research Office grant DAAD19-01-1-0535.

Signed and Sealed this
First Day of July, 2014

Michelle K. Lee
*Deputy Director of the United States Patent and Trademark Office*